United States Patent
Xu et al.

(10) Patent No.: US 11,257,848 B2
(45) Date of Patent: Feb. 22, 2022

(54) ARRAY SUBSTRATE, MANUFACTURING METHOD THEREOF AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Yuanjie Xu, Beijing (CN); Shan Gao, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 367 days.

(21) Appl. No.: 16/342,421

(22) PCT Filed: Aug. 9, 2018

(86) PCT No.: PCT/CN2018/099537
§ 371 (c)(1),
(2) Date: Apr. 16, 2019

(87) PCT Pub. No.: WO2019/042107
PCT Pub. Date: Mar. 7, 2019

(65) Prior Publication Data
US 2019/0252413 A1   Aug. 15, 2019

(30) Foreign Application Priority Data

Aug. 31, 2017 (CN) .......................... 201710778806.7

(51) Int. Cl.
*H01L 27/12* (2006.01)
*H01L 23/58* (2006.01)
(Continued)

(52) U.S. Cl.
CPC ...... *H01L 27/124* (2013.01); *G02F 1/133512* (2013.01); *G02F 1/136277* (2013.01);
(Continued)

(58) Field of Classification Search
None
See application file for complete search history.

(56) References Cited

U.S. PATENT DOCUMENTS

2008/0137022 A1* 6/2008 Komeno ............... G02F 1/1339
349/153
2013/0063406 A1* 3/2013 Nishino .............. G02F 1/13452
345/204

FOREIGN PATENT DOCUMENTS

KR     20060028519 A  *  3/2006  ............. G02F 1/136

* cited by examiner

*Primary Examiner* — Edward J Glick
*Assistant Examiner* — Anthony G Quash
(74) *Attorney, Agent, or Firm* — Myers Bigel, P.A.

(57) ABSTRACT

The present disclosure relates to the field of display technology, and provides an array substrate, a manufacturing method thereof and a display device. The array substrate includes a display region and a wiring region surrounding thereof. The array substrate further includes a base substrate, a first conductive layer, a first insulating layer, a second conductive layer, a second insulating layer and a patterned shielding layer disposed sequentially thereon. The shielding layer includes a shielding portion in the wiring region. The first and second conductive layers include respectively first and second signal lead wires in the wiring region. There is no overlap between orthographic projections of the first and second signal lead wires on the base substrate. A difference between vertical distances from the first signal lead wire and from the second signal lead wire to the shielding layer is smaller than a thickness of the first insulating layer.

13 Claims, 5 Drawing Sheets

(51) Int. Cl.
*G02F 1/1362* (2006.01)
*G02F 1/1333* (2006.01)
*G02F 1/1345* (2006.01)
*G02F 1/1335* (2006.01)

(52) U.S. Cl.
CPC ...... *G02F 1/136286* (2013.01); *H01L 23/585* (2013.01); *H01L 27/127* (2013.01); *H01L 27/1259* (2013.01)

forming a transparent conductive film on the base substrate, and performing a patterning process on the transparent conductive film to form a pixel electrode pattern in the display region of the array substrate and an etch stop pattern — S2012

Fig. 12 forming a first conductive layer, a first insulating layer and a second conductive layer sequentially on the base substrate, wherein the first conductive layer includes a first signal lead wire in the wiring region, the second conductive layer includes the second signal lead wire in the wiring region, and there is no overlap between the orthographic projection of the first signal lead wire on the base substrate and the orthographic projection of the second signal lead wire on the base substrate — S301 forming a non-conductive medium pattern on the base substrate on which the second conductive layer is formed, wherein the non-conductive medium pattern is located between the second conductive layer and the shielding layer, and corresponds to the orthographic projection of the second signal lead wire — S302 forming a second insulating layer on the base substrate on which the second conductive layer is formed — S303 forming a patterned shielding layer on the second insulating layer, wherein the patterned shielding layer includes a shielding portion in the wiring region — S304

ARRAY SUBSTRATE, MANUFACTURING METHOD THEREOF AND DISPLAY DEVICE

CROSS REFERENCE TO RELATED APPLICATIONS

The present application is a 35 U.S.C. 371 national stage application of PCT International Application No. PCT/CN2018/099537, filed on Aug. 9, 2018, which claims the benefit of Chinese Patent Application No. 201710778806.7, filed on Aug. 31, 2017, the contents of which are incorporated herein by reference in their entireties. The above-referenced International application was published in the Chinese language as International Application Publication No. WO 2019/042107 on Mar. 7, 2019.

TECHNICAL FIELD

The present disclosure relates to the field of display technology, and in particular to an array substrate, a manufacturing method thereof and a display device.

BACKGROUND

A thin film transistor liquid crystal display (TFT-LCD) generally includes an array substrate, a color filter substrate, and a liquid crystal layer therebetween. Specifically, a display region of the array substrate includes a plurality of sub-pixels defined by gate lines and data lines that are horizontally and vertically intersecting with each other. In addition, the gate lines and the data lines intersecting horizontally and vertically with each other in the display region are respectively led out by gate signal lead wires and data signal lead wires in the fan-out region, and finally bind with an integrated circuit (IC) chip.

At the instant when the display is turned on, an electrical signal in the gate line changes abruptly, and a large amount of induced charges are generated on the black matrix (BMs) at the corresponding gate signal lead wire of the fan-out region. After a large amount of induced charges are diffused into the display region by the BM, an additional electric field is generated at edge of the display region, and the liquid crystal molecules at edge of the display region are correspondingly deflected. Thus, a white line is generated at edge of the display region when turning on the display, thereby affecting the display effect.

SUMMARY

According to an aspect of the present disclosure, an array substrate is provided. Specifically, the array substrate includes a display region and a wiring region surrounding the display region. The array substrate further includes: a base substrate; and a first conductive layer, a first insulating layer, a second conductive layer, a second insulating layer and a patterned shielding layer disposed sequentially on the base substrate. The shielding layer includes a shielding portion in the wiring region. The first conductive layer includes a first signal lead wire in the wiring region, and the second conductive layer includes a second signal lead wire in the wiring region. There is no overlap between an orthographic projection of the first signal lead wire on the base substrate and an orthographic projection of the second signal lead wire on the base substrate. A difference between a vertical distance from the first signal lead wire to the shielding portion and a vertical distance from the second signal lead wire to the shielding portion is smaller than a thickness of the first insulating layer. An orthographic projection of the shielding portion on the base substrate covers the orthographic projections of the first signal lead wire and the second signal lead wire.

According to some optional implementations, in the array substrate provided by embodiments of the present disclosure, the vertical distance from the first signal lead wire to the shielding portion is equal to the vertical distance from the second signal lead wire to the shielding portion.

According to some optional implementations, in the array substrate provided by embodiments of the present disclosure, the second insulating layer includes a thinned region, and an orthographic projection of the thinned region on the base substrate at least covers the orthographic projection of the first signal lead wire on the base substrate, but does not cover the orthographic projection of the second signal lead wire on the base substrate.

According to some optional implementations, in the array substrate provided by embodiments of the present disclosure, a thickness of the second insulating layer in the thinned region is 0.

According to some optional implementations, the array substrate provided by embodiments of the present disclosure further includes an etch stop pattern disposed in the thinned region of the second insulating layer.

According to some optional implementations, in the array substrate provided by embodiments of the present disclosure, the etch stop pattern is formed of a non-conductive medium.

According to some optional implementations, in the array substrate provided by embodiments of the present disclosure, the etch stop pattern is formed in a same layer and of a same material as an active layer pattern in the display region of the array substrate.

According to some optional implementations, in the array substrate provided by embodiments of the present disclosure, the etch stop pattern is formed of a conductive material and formed integrally with the shielding layer.

According to some optional implementations, in the array substrate provided by embodiments of the present disclosure, the etch stop pattern is formed in a same layer and of a same material as a pixel electrode pattern in the display region of the array substrate.

According to some optional implementations, the array substrate provided by embodiments of the present disclosure further includes a non-conductive medium pattern between the second conductive layer and the shielding layer. An orthographic projection of the non-conductive medium pattern on the base substrate at least covers the orthographic projection of the second signal lead wire on the base substrate, but does not cover the orthographic projection of the first signal lead wire on the base substrate.

According to some optional implementations, in the array substrate provided by embodiments of the present disclosure, the non-conductive medium pattern is located between the second conductive layer and the second insulating layer.

According to some optional implementations, in the array substrate provided by embodiments of the present disclosure, the non-conductive medium pattern is located between the second insulating layer and the shielding layer.

According to another aspect of the present disclosure, a display device is also provided. The display device includes the array substrate as described in any of the above embodiments.

According to yet another aspect of the present disclosure, a manufacturing method for an array substrate is also provided. The manufacturing method includes the following steps: forming a first conductive layer, a first insulating layer and a second conductive layer sequentially on a base substrate, wherein the first conductive layer includes a first signal lead wire, the second conductive layer includes a second signal lead wire, and there is no overlap between an orthographic projection of the first signal lead wire on the base substrate and an orthographic projection of the second signal lead wire on the base substrate; forming an insulating film covering the second conductive layer on the base substrate, and thinning a portion to be thinned of the insulating film to obtain a second insulating layer with a thinned region, wherein an orthographic projection of the portion to be thinned on the base substrate at least covers the orthographic projection of the first signal lead wire on the base substrate, but does not cover the orthographic projection of the second signal lead wire on the base substrate; and forming a patterned shielding layer on the second insulating layer, the shielding layer including a shielding portion. Further, the array substrate includes a display region and a wiring region surrounding the display region, wherein the first signal lead wire, the second signal lead wire and the shielding portion are formed in the wiring region. An orthographic projection of the shielding portion on the base substrate covers the orthographic projections of the first signal lead wire and the second signal lead wire.

According to some optional implementations, the manufacturing method for an array substrate provided by embodiments of the present disclosure further includes the following steps: after forming the first insulating layer on the base substrate, and before forming the insulating film covering the second conductive layer, forming an etch stop pattern, wherein an orthographic projection of the etch stop pattern on the second insulating layer overlaps with the thinning region.

According to some optional implementations, in the manufacturing method for an array substrate provided by embodiments of the present disclosure, the step of forming the etch stop pattern includes the following sub-step: forming a semiconductor film on the base substrate, and performing a patterning process on the semiconductor film to form an active layer pattern in the display region of the array substrate and the etch stop pattern.

According to some optional implementations, in the manufacturing method for an array substrate provided by embodiments of the present disclosure, the step of forming the etch stop pattern includes the following sub-step: forming a transparent conductive film on the base substrate, and performing a patterning process on the transparent conductive film to form a pixel electrode pattern in the display region of the array substrate and the etch stop pattern.

BRIEF DESCRIPTION OF THE DRAWINGS

In order to illustrate the technical solutions in embodiments of the present disclosure more clearly, the appended drawings required to be used in the description of embodiments will be introduced briefly in the following. Obviously, the drawings in the following description are only some embodiments of the present disclosure, and for those of ordinary skills in the art, other embodiments can be obtained according to these drawings under the premise of not paying out creative work.

FIG. 12 is a flow chart of a manufacturing method for an array substrate according to another embodiment of the present disclosure; and FIG. 13 is a flow chart of a manufacturing method for an array substrate according to another embodiment of the present disclosure.

DETAILED DESCRIPTION

Figure 1:
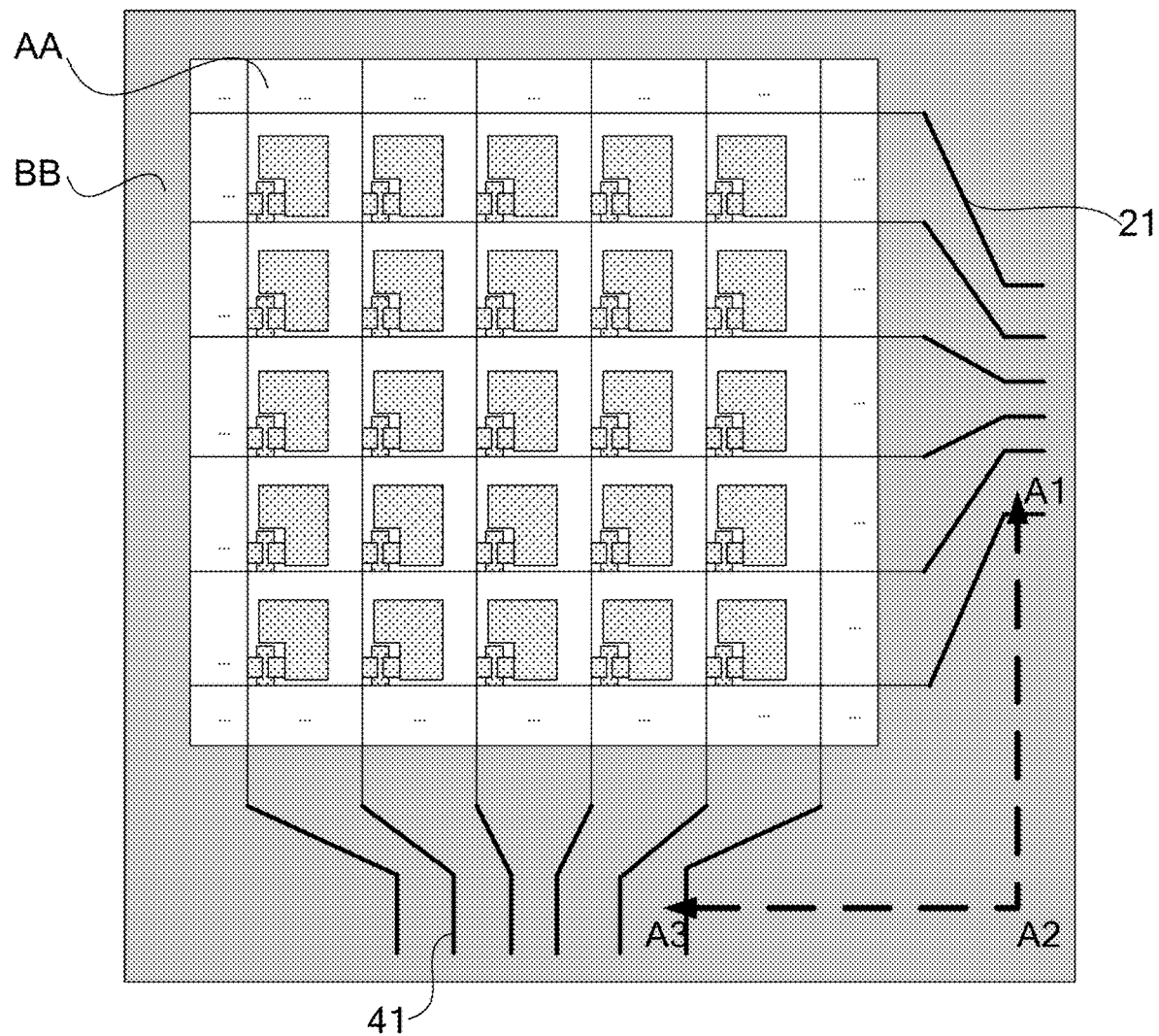
FIG. 1 is a schematic structural view of an array substrate according to an embodiment of the present disclosure.

In the following, the technical solutions in embodiments of the present disclosure will be described clearly and completely in connection with the drawings in embodiments of the present disclosure. Obviously, the described embodiments are only part of the embodiments in the present disclosure, but not all of them. Based on these embodiments in the present disclosure, all other embodiments obtained by those of ordinary skills in the art under the premise of not paying out creative work shall fall within the protection scope of the present disclosure.

In the following description, the following reference numerals will be used to refer to various components in embodiments of the present disclosure: 10—base substrate; 20—first conductive layer; 21—first signal lead wire; 211—gate signal lead wire; 30—first insulating layer; 40—second conductive layer; 41—second signal lead wire; 411—data signal lead wire; 50—second insulating layer; 60—shielding layer; 61—shielding portion; 70—etch stop pattern; 80—non-conductive medium pattern; AA—display region; BB—wiring region; X—thinned region of second insulating layer; h1—vertical distance from first signal lead wire to shielding layer; h2—vertical distance from second signal lead wire to shielding layer; and h3—thickness of first insulating layer.

In order to avoid the white line generated when turning on the display and influences caused thereby on the display effect, a shielding layer is usually disposed above the gate signal lead wire in the fan-out region. With shielding, it is possible to prevent the induced charges from being generated on BM when the electrical signal on gate line changes abruptly. When the gate signal lead wires and the data signal lead wires in the fan-out region form a double-layer wiring structure, that is, when the gate signal lead wires and the data signal lead wires are in different layers, there is usually an insulating layer therebetween. In such a case, if there is a first distance between the gate signal lead wire and the shielding layer and a second distance between the data signal lead wire and the shielding layer, then typically the first distance and the second distance will be significantly different. Those skilled in the art should be clear that the calculation formula for capacitance of a plate capacitor is as follows:

$$C = \frac{Q}{U} = \frac{\varepsilon S}{4\pi k d} \quad (1)$$

where F is a constant, S is a facing area of the capacitor plate, d is the distance between the capacitor plates, and k is the electrostatic force constant.

From the above calculation formula (1), it is known that the capacitance generated between the gate signal lead wire and the shielding layer is inversely proportional to the first distance between the two. Likewise, the capacitance generated between the data signal lead wire and the shielding layer will be inversely proportional to the second distance between the two. Since the first distance and the second distance are significantly different, the difference between the two capacitance values is large, with sometimes one being more than twice as large as the other. The large difference in capacitance value can cause different delay times for signal transmission. Therefore, it tends to cause horizontal streaks in display because there is a large difference in the on/off time difference of signal between two lines, thereby seriously influencing the display effect and reducing the product quality.

Figure 2:
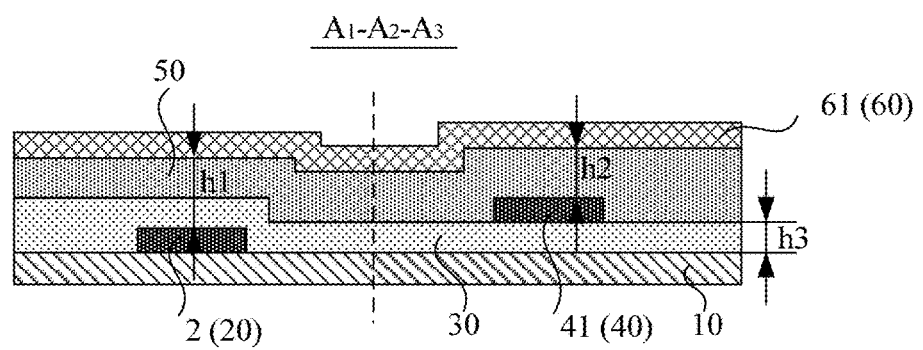
FIG. 2 is a cross-sectional view along a fold line A1-A2-A3 in FIG. 1.

Embodiments of the present disclosure provide an array substrate. As shown in FIG. 1, the array substrate includes a display region AA and a wiring region BB other than the display region. Further, as shown in FIG. 2, the array substrate further includes: a base substrate 10; and a first conductive layer 20, a first insulating layer 30, a second conductive layer 40, a second insulating layer 50 and a patterned shielding layer 60 disposed sequentially on the base substrate 10. The patterned shielding layer 60 includes a shielding portion 61 in the wiring region BB. The first conductive layer 20 includes a first signal lead wire 21 in the wiring region BB, and the second conductive layer 40 includes a second signal lead wire 41 in the wiring region BB, wherein an orthographic projection of the first signal lead wire 21 on the base substrate 10 does not overlap with an orthographic projection of the second signal lead wire 41 on the base substrate 10. A difference between a vertical distance h1 from the first signal lead wire 21 to the shielding layer 60 and a vertical distance h2 from the second signal lead wire 41 to the shielding layer 60 is smaller than a thickness h3 of the first insulating layer 30.

It should be noted that, as shown in FIG. 2 (wherein FIG. 2 is a cross-sectional view along a fold line A1-A2-A3 in FIG. 1), a first signal line included by the first conductive layer 20 in the display region AA and a second signal line included by the second conductive layer 40 are not shown in the cross-sectional view of FIG. 2, because the fold line A1-A2-A3 in FIG. 1 does not pass through the display region AA. As shown in FIG. 1, the first signal line in the display region AA and the first signal lead wire 21 in the wiring region BB are connected to each other, while the second signal line in the display region AA and the second signal lead wires 41 in the wiring region BB are connected to each other. As shown in FIG. 2, the first signal lead wire 21 and the second signal lead wire 41 form a double-layered wiring, and the orthographic projection of the first signal lead wire 21 does not overlap with the orthographic projection of the second signal lead wire 41.

It should also be noted that the expression of "the first conductive layer 20, the first insulating layer 30, the second conductive layer 40, the second insulating layer 50 and the patterned shielding layer 60 disposed sequentially", as used in embodiments of the present disclosure, is only used to describe the order in which these layers are formed, but not to limit that the adjacent two layers must be attached to each other. For example, other layers may also be disposed between the second conductive layer 40 and the second insulating layer 50, as long as the second conductive layer 40 is firstly disposed and the second insulating layer 50 is disposed after the first conductive layer 40. Relationships between other layers that are sequentially disposed can be understood in a similar way.

Further, it should be emphasized that in embodiments of the present disclosure, layers on the base substrate 10, for example, the second insulating layer 50, may be one film made of an insulating material, or multiple films made of various insulating materials. The present disclosure is not specifically limited in this.

In addition, as shown in FIG. 1, the first signal line and the second signal line in the display region AA may be a gate line and a data line, respectively. In embodiments of the present disclosure, it is not limited that the first signal line is a gate line and the second signal line is a data line, or the first signal line is a data line and the second signal line is a gate line. However, in the following detailed description, as an example, the first signal line is taken as a gate line and the second signal line is taken as a data line. That is, the first signal lead wire 21 is a gate signal lead wire, and the second signal lead wire 41 is a data signal lead wire.

Finally, it should also be noted that the capacitance generated between the shielding layer 60 and the signal lead wire is inversely proportional to the vertical distance between the signal line and the shielding layer 60. As shown in FIG. 2, since the first signal lead wire 21 and the second signal lead wire 41 form a double-layer wiring and the first insulating layer 30 with the thickness of h3 is located therebetween, this may result in a large difference between the first capacitance, as generated between the shielding layer 60 and the first signal lead wire 21, and the second capacitance, as generated between the shielding layer 60 and the second signal lead wire 41. In such a case, it may also result in a large difference in signal transmission delay time between the first signal lead wire 21 and the second signal lead wire 41. Therefore, by reducing the difference between the vertical distance h1 from the first signal lead wire 21 to the shielding layer 60 and the vertical distance h2 from the second signal lead wire 41 to the shielding layer 60, and making the difference smaller than the thickness h3 of the first insulating layer 30, the difference in signal transmission delay time between the first signal lead wire 21 and the second signal lead wire 41 can be reduced.

Embodiments of the present disclosure provide an array substrate, a manufacturing method thereof and a display device. The array substrate includes a display region and a wiring region other than the display region. The array substrate further includes a base substrate, and a first conductive layer, a first insulating layer, a second conductive layer, a second insulating layer and a patterned shielding layer disposed sequentially on the base substrate. The patterned shielding layer includes a shielding portion in the wiring region. The first conductive layer includes a first signal lead wire in the wiring region, and the second conductive layer includes a second signal lead wire in the wiring region. An orthographic projection of the first signal lead wire on the base substrate does not overlap with an orthographic projection of the second signal lead wire on the base substrate. Further, a difference between a vertical distance from the first signal lead wire to the shielding layer and a vertical distance from the second signal lead wire to the shielding layer is smaller than a thickness of the first insulating layer. In the array substrate provided by embodiments of the present disclosure, by reducing the difference between the vertical distance from the first signal lead wire to the shielding layer and the vertical distance from the second signal lead wire to the shielding layer, the difference between the signal transmission delay time on the first signal lead wire and the signal transmission delay time on the second signal lead wire can be reduced. Therefore, the horizontal streaks which may occur in the display process of the display panel can be alleviated, thereby improving the display effect.

Figure 3:
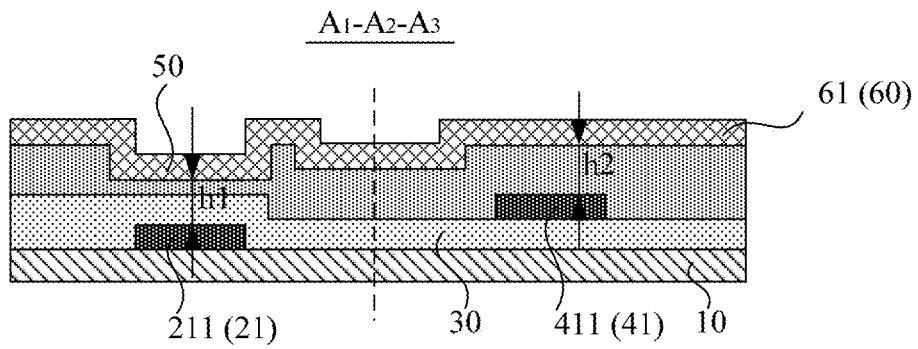
FIG. 3 is another cross-sectional view along a fold line A1-A2-A3 in FIG. 1.

Optionally, as shown in FIG. 3, the vertical distance h1 from the first signal lead wire 21 to the shielding layer 60 is equal to the vertical distance h2 from the second signal lead wire 41 to the shielding layer 60.

As shown in FIG. 3, optionally, when the vertical distance h1 from the gate signal lead wire 211 to the shielding layer 60 is selected to be equal to the vertical distance h2 from the data signal lead wire 411 to the shielding layer 60, the signal transmission delay time on the gate signal lead wire 211 can be the same as the signal transmission delay time on the data signal lead wire 411. Thereby, in the display process of the display panel, the horizontal streaks due to the inconsistent signal transmission delay time between the gate signal lead wire 211 and the data signal lead wire 411 can be avoided.

It should be noted that, according to the above formula (1), when powered on, the capacitance generated between the first signal lead wire 21 and the shielding layer 60 is related to the vertical distance h1 from the first signal lead wire 21 to the shielding layer 60. Likewise, when powered on, the capacitance generated between the second signal lead wire 41 and the shielding layer 60 is related to the vertical distance h2 from the second signal lead wire 41 to the shielding layer 60. The smaller the difference between the vertical distance h1 from the first signal lead wire 21 to the shielding layer 60 and the vertical distance h2 from the second signal lead wire 41 to the shielding layer 60, the smaller the difference between the capacitance values associated with the two is. This results in a smaller difference between the signal transmission delay time on the first signal lead wire 21 and that on the second signal lead wire 41. Therefore, it will be most advantageous if h1 is equal to h2. However, considering influences from factors such as the manufacturing process, the approximate equality of h1 and h2 within a certain error range also falls within the range of equality as described in embodiments of the present disclosure.

Figure 4:
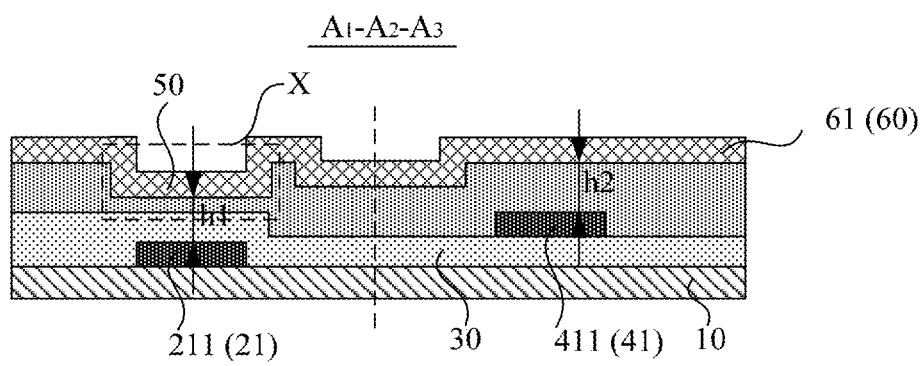
FIG. 4 is another cross-sectional view along a fold line A1-A2-A3 in FIG. 1.

Generally, the vertical distance h1 from the first signal lead wire 21 to the shielding layer 60 is relatively large. As shown in FIG. 4, optionally, the second insulating layer 50 includes a thinned region X, wherein the thinned region X is disposed at least at a position corresponding to the orthographic projection of the first signal lead wire 21 on the base substrate, but not at a position corresponding to the orthographic projection of the second signal lead wire 41 on the base substrate.

As shown in FIG. 4, a thinned region X is provided on the second insulating layer 50, wherein the thinned region X includes at least a region corresponding to the orthographic projection of the gate signal lead wire 211 on the base substrate. That is, as shown in FIG. 4, the thinned region X may be disposed only above the orthographic projection of the gate signal lead wire 211, for reducing the vertical distance h1 between the gate signal lead wire 211 and the shielding layer 60. Alternatively, the thinned region X may also include a region other than the orthographic projection of the gate signal lead wire 211, as long as the thinned region X is not disposed above the orthographic projection of the data signal lead wire 411.

By disposing the thinned region X of the second insulating layer 50 above the orthographic projection of the gate signal lead wire 211, a portion of the second insulating layer 50 above the orthographic projection of the gate signal lead wire 211 has a reduced thickness. Further, since the thinned region X is not disposed above the orthographic projection of the data signal lead wire 411, a portion of the second insulating layer 50 above the orthographic projection of the data signal lead wire 411 keeps constant in thickness. In such a case, the other layers between the gate signal lead wire 211/the data signal lead wire 411 and the shielding layer 60 are also kept constant in thickness. In this way, by reducing the thickness for a portion of the second insulating layer 50 above the orthographic projection of the gate signal lead wire 211, the difference between the vertical distance from the gate signal lead wire 211 to the shielding layer 60 and the vertical distance from the data signal lead wire 411 to the shielding layer 60 can be reduced. Thus, the capacitance value between the gate signal lead wire 211 and the shielding layer 60 is approximate to the capacitance value between the data signal lead wire 411 and the shielding layer 60.

It should be noted that, in embodiments of the present disclosure, the way for forming the thinned region X is not specifically limited. Exemplarily, the thinned region X may be etched by a patterning process for the purpose of thinning a portion of the second insulating layer 50 in thickness. Specifically, the thickness to be removed in the thinned region X of the second insulating layer 50 can be controlled by the etching time.

Figure 5:
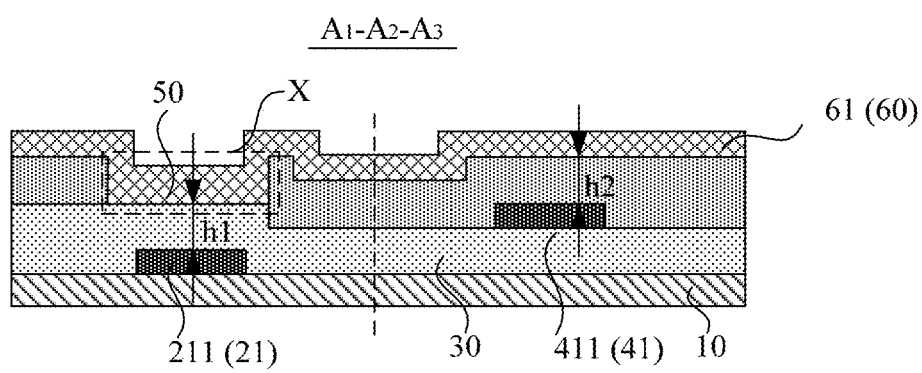
FIG. 5 is another cross-sectional view along a fold line A1-A2-A3 in FIG. 1.

Optionally, as shown in FIG. 5, the thickness of the second insulating layer 50 in the thinned region X is set to be 0.

As shown in FIG. 5, exemplarily, in the array substrate provided by embodiments of the present disclosure, the first signal line disposed in the display region AA of the base substrate 10 is a gate line, and the first signal lead wire 21 disposed in the wiring region BB is a gate signal lead wire 211. In this case, after the first insulating layer 30 is formed, the data line in the display region AA and the data signal lead wire 411 (i.e., the second signal lead wire 41) in the wiring region BB are formed continuously. Next, after the data signal lead wire 411 is formed, a second insulating layer 50 (also referred to as a passivation layer) is formed. Generally, the first insulating layer 30 and the second insulating layer 50 are equal in thickness. Therefore, when the thickness of the second insulating layer 50 in the thinned region X is 0, the vertical distance from the gate signal lead wire 211 to the shielding layer 60 will include only the thickness of the first insulating layer 30. Meanwhile, the vertical distance from the data signal lead wire 411 to the shielding layer 60 includes only the thickness of the second insulating layer 50. In this way, the vertical distance from the gate signal lead wire 211 to the shielding layer 60 is equal or approximately equal to the vertical distance from the data signal lead wire 411 to the shielding layer 60. Thereby, the capacitance value between the gate signal lead wire 211 and the shielding layer 60 is equal or approximately equal to the capacitance value between the data signal lead wire 411 and the shielding layer 60.

Figure 6:
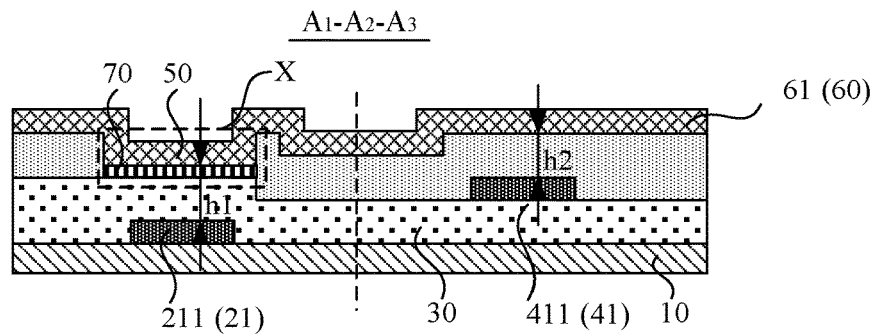
FIG. 6 is another cross-sectional view along a fold line A1-A2-A3 in FIG. 1.

Further, according to an embodiment of the present disclosure, the array substrate further includes an etch stop pattern 70 located between the second insulating layer 50 and the first insulating layer 30, and corresponding further to the thinned region X (e.g., disposed in the thinned region X), as shown in FIG. 6.

As shown in FIG. 6, when the second insulating layer 50 is thinned by an etching process, sometimes it is difficult to control the etching degree accurately only by controlling the etching time or the like. Therefore, in a case where the thickness of the second insulating layer 50 in the thinned region X is reduced to 0 by etching, etching and thinning of the first insulating layer 30 below the second insulating layer 50 may inevitably be caused. Therefore, the etch stop pattern 70 can be disposed between the second insulating layer 50 and the first insulating layer 30 and corresponding further to the thinned region X. For example, a material for the etch stop pattern 70 is selected to be different from a material for the second insulating layer 50. In this way, when the thinned region X of the second insulating layer 50 is subjected to an etching and thinning process, particularly when the thickness of the thinned region X is reduced to 0, the etchant in contact with the etch stop pattern 70 will not react with the etch stop pattern 70 to thin the thickness of the etch stop pattern 70. Thereby, on the one hand, it is possible to ensure complete etching in the thinned region X of the second insulating layer 50, while on the other hand, it is also possible to protect the first insulating layer 30 and avoid excessive etching.

Optionally, as shown in FIG. 6, the etch stop pattern 70 is made of a non-conductive medium. In such a case, considering the capacitance, the vertical distance h1 from the first signal lead wire 21 to the shielding layer 60 will include the thickness of the etch stop pattern 70.

The etch stop pattern 70 can be formed by using a non-conductive material. In such a case, the layer of non-conductive material between the first signal lead wire 21 and the shielding layer 60 will include the etch stop pattern 70. Therefore, when considering the capacitance value, the vertical distance h1 from the first signal lead wire 21 to the shielding layer 60 will include the thickness of the etch stop pattern 70. As shown in FIG. 6, h1 will be the sum of thickness of the first insulating layer 30 and thickness of the etch stop pattern 70.

Optionally, the etch stop pattern 70 is formed in a same layer and of a same material as the active layer pattern in the display region AA of the array substrate.

In the display region AA of the array substrate, after forming the gate line and the gate insulating layer, it is also necessary to form an active layer pattern for fabricating a thin film transistor. Typically, the active layer pattern in display region AA is formed by using a semiconductor material, and the etch stop pattern 70 in wiring region BB is formed by using a non-conductive material. In such a case, the etch stop pattern 70 can be formed by using the semiconductor material as well. Thus, the etch stop pattern 70 in the wiring region BB can be formed while patterning the active layer pattern in the display region AA. This means that no extra step is required for fabricating the etch stop pattern 70.

Figure 7:
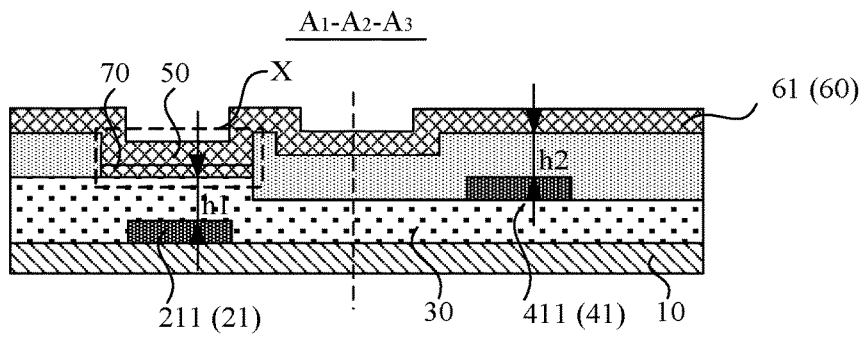
FIG. 7 is another cross-sectional view along a fold line A1-A2-A3 in FIG. 1.

Optionally, as shown in FIG. 7, the etch stop pattern 70 may also be made of a conductive material. Further, the etch stop pattern 70 may be formed integrally with the shielding layer 60.

The etch stop pattern 70 may be formed by a conductive material. In this case, when considering the capacitance value, the layer of non-conductive material between the gate signal lead wire 211 and the shielding layer 60 will not include the etch stop pattern 70 made of a conductive material. Generally, the shielding layer 60 is also made of a conductive material. As shown in FIG. 7, for example, the etch stop pattern 70 is in contact with the shielding layer 60 at a position of the thinned region X. That is, the etch stop pattern 70 is formed integrally with the shielding layer 60. In this way, since the etch stop pattern 70 is located below the shielding layer 60 at a position of the thinned region X, and the etch stop pattern 70 is formed integrally with the shielding layer 60, the vertical distance h1 from the gate signal lead wire 211 to the shielding layer 60 is the distance from the gate signal lead wire 211 to the lower surface of the etch stop pattern 70, as shown in FIG. 7, i.e. the thickness of the first insulating layer 30.

Compared with the above-described etch stop pattern 70 formed by a non-conductive medium, the etch stop pattern 70 formed by a conductive material can avoid the extra introducing of thickness of the etch stop pattern 70 when thinning the vertical distance h1 from the gate signal lead wire 211 to the shielding layer 60 to reduce the difference between the vertical distance h1 from the gate signal lead wire 211 to the shielding layer 60 and the vertical distance h2 from the data signal lead wire 411 to the shielding layer 60.

Optionally, the etch stop pattern 70 is formed in a same layer and of a same material as the pixel electrode pattern in the display region AA of the array substrate.

In the display region AA of the array substrate, after the TFT structure is formed, it is also necessary to form a pixel electrode pattern. Generally, the pixel electrode pattern in the display region AA is made of a transparent conductive material. When the etch stop pattern 70 in the wiring region BB is made of a conductive material, the etch stop pattern 70 can be formed by a transparent conductive material as well. In this case, the etch stop pattern 70 in the wiring region BB may be formed while patterning the pixel electrode pattern in the display region AA. That is, it is not necessary to add an extra step for fabricating the etch stop pattern 70.

Figure 8A:
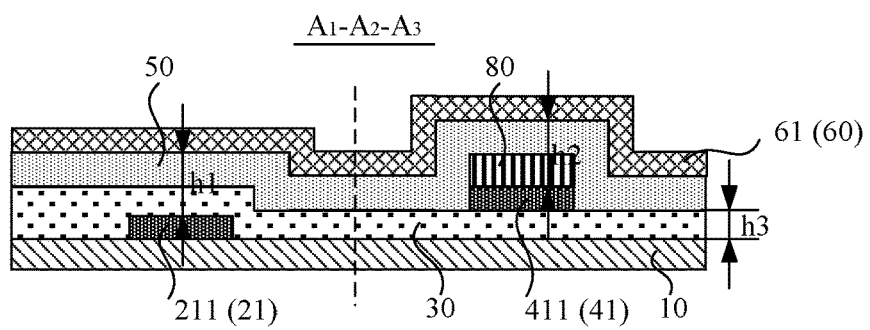
FIG. 8a is another cross-sectional view along a fold line A1-A2-A3 in FIG. 1.

Optionally, as shown in FIG. 8a, a non-conductive medium pattern 80 is further disposed between the second conductive layer 40 and the shielding layer 60. Further, the non-conductive medium pattern 80 is disposed at least at a position corresponding to the orthographic projection of the second signal lead wire 41, but not disposed at a position corresponding to the orthographic projection of the first signal lead wire 21.

As shown in FIG. 8a, a non-conductive medium pattern 80 is disposed between the second conductive layer 40 and the shielding layer 60. Specifically, the non-conductive medium pattern 80 is disposed at least at a position corresponding to the orthographic projection of the data signal lead wire 411, and the non-conductive medium pattern 80 is not disposed at a position corresponding to the orthographic projection of the gate signal lead wire 211. In this way, by introducing the non-conductive medium pattern 80, the vertical distance h2 between the data signal lead wire 411 and the shielding layer 60 can be increased. Thus, the vertical distance h1 between the gate signal lead wire 211 and the shielding layer 60 is made to be approximate to the vertical distance h2 between the data signal lead wire 411 and the shielding layer 60.

Figure 8B:
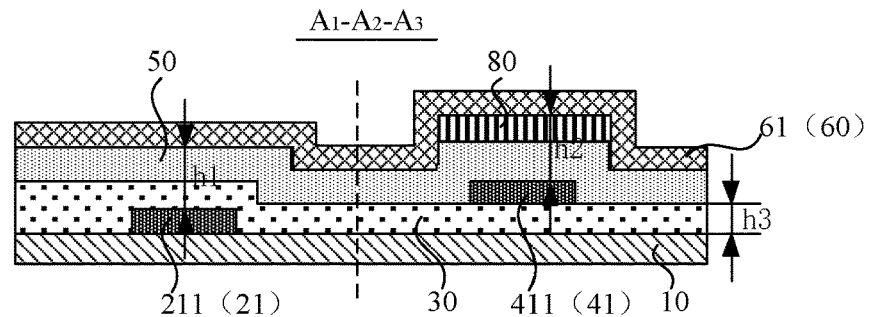
FIG. 8b is another cross-sectional view along a fold line A1-A2-A3 in FIG. 1.

In some embodiments, as shown in FIG. 8b, the non-conductive medium pattern 80 is between the second insulating layer 50 and the shielding layer 60.

Further optionally, as shown in FIG. 8a, the vertical distance h1 between the gate signal lead wire 211 and the shielding layer 60 is the sum of thickness of the first insulating layer 30 and thickness of the second insulating layer 50, while the vertical distance h2 between the data signal lead wire 411 and the shielding layer 60 is the sum of thickness of the second insulating layer 50 and thickness of the non-conductive medium pattern 80. Therefore, by selecting the thickness of the non-conductive medium pattern 80 to be equal to the thickness of the first insulating layer 50, the vertical distance h1 between the gate signal lead wire 211 and the shielding layer 60 can be made equal to the vertical distance h2 between the data signal lead wire 411 and the shielding layer 60. In this way, the signal transmission delay time on the gate signal lead wire 211 can be made the same as the signal transmission delay time on the data signal lead wire 411. Finally, in the display process of the display panel, the horizontal streaks which are easily generated due to the inconsistent signal transmission delay time between the gate signal lead wire 211 and the data signal lead wire 411 can be avoided.

It should be noted that TFTs in the display region AA of the array substrate may be divided into a bottom gate type and a top gate type according to the positional relationship between the gate and the gate insulating layer with respect to the base substrate. The bottom gate type refers to a type where a gate is located on a side closer to the base substrate as compared with the gate insulating layer (corresponding to the first insulating layer 30 in embodiments of the present disclosure). In contrast, the top gate type refers to a type where a gate is located on a side farer away from the base substrate as compared with the gate insulating layer. In the detailed description of above embodiments, as an example, the description is made by taking the first signal lead wire 21 as a gate signal lead wire 211, the first signal line as a gate line, and TFTs in the array substrate as a bottom gate type structure. However, embodiments of the present disclosure are not limited thereto. That is, the array substrate may have a top gate type structure as well, where the first signal line is a data line and the first signal lead wire 21 is a data signal lead wire 411. For other implementations and working principles thereof, it will be similar to the bottom and top gate types, and will not be described again here.

According to another aspect of the present disclosure, embodiments further provide a display device including the array substrate as described in any of the above embodiments.

In the display device provided by embodiments of the present disclosure, by selecting the difference between the vertical distance h1 from the first signal lead wire 21 in the wiring region BB to the shielding layer 60 and the vertical distance from the second signal lead wire 41 to the shielding layer 60 to be less than the thickness h3 of the first insulating layer 30, the difference between the signal transmission delay time on the first signal lead wire and the signal transmission delay time on the second signal lead wire can be reduced, thereby alleviating the horizontal streaks for the display device.

In the above detailed description of specific structure, working principle and achievable effects of the array substrate according to embodiments of the present disclosure, the display device including the array substrate according to embodiments of the present disclosure has been described in detail, which will not be described in detail again.

Figures 9, 10, 11:
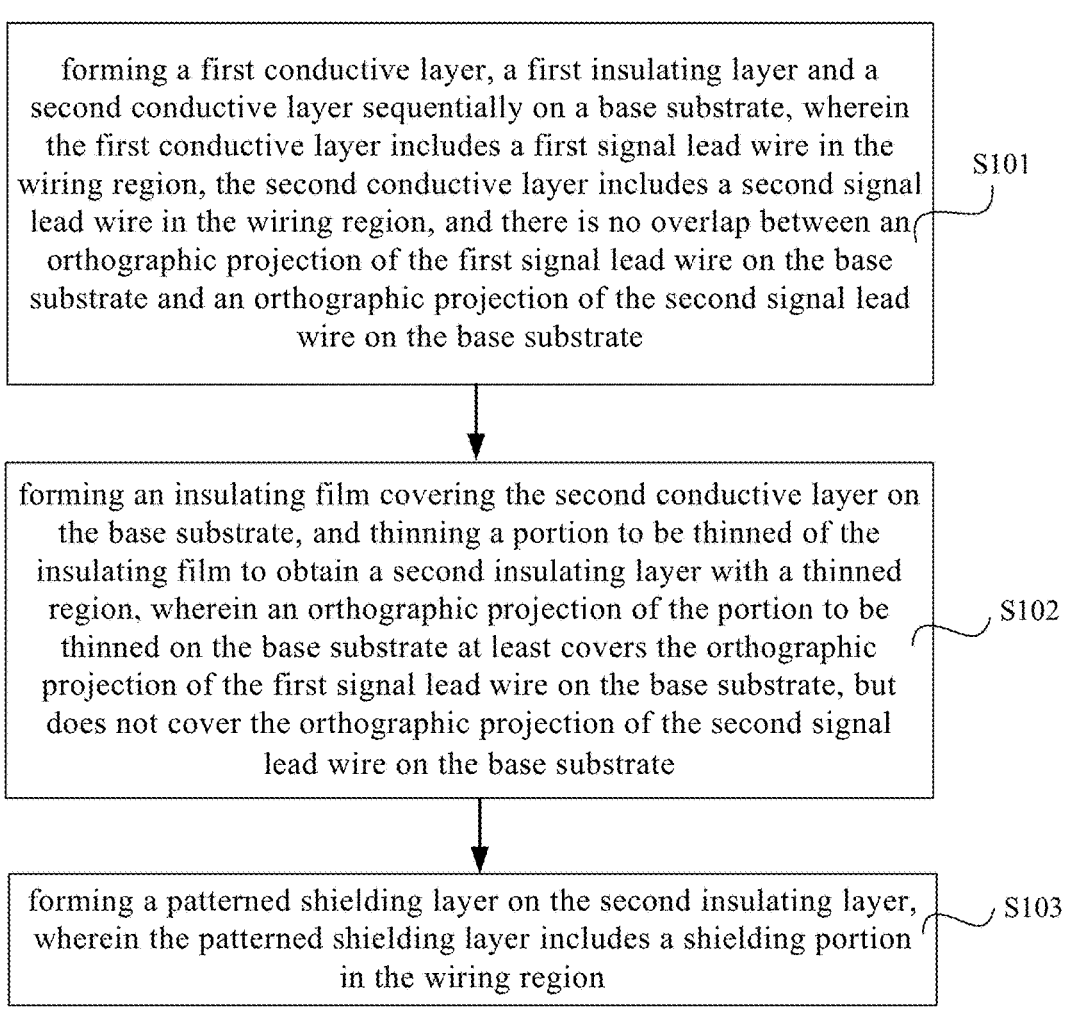
FIG. 9 is a flow chart of a manufacturing method for an array substrate according to an embodiment of the present disclosure.
FIG. 10 is a flow chart of a manufacturing method for an array substrate according to another embodiment of the present disclosure.
FIG. 11 is a flow chart of a manufacturing method for an array substrate according to another embodiment of the present disclosure.

According to yet another aspect of the present disclosure, embodiments provide a manufacturing method for an array substrate. As shown in FIG. 9, the manufacturing method for an array substrate includes the following steps.

S101, forming a first conductive layer 20, a first insulating layer 30 and a second conductive layer 40 sequentially on a base substrate 10, wherein the first conductive layer 20 includes a first signal lead wire 21 in the wiring region BB, the second conductive layer 40 includes a second signal lead wire 41 in the wiring region BB, and an orthographic projection of the first signal lead wire 21 on the base substrate does not overlap with an orthographic projection of the second signal lead wire 41 on the base substrate.

S102, forming an insulating film covering the second conductive layer 40 on the base substrate 10, and thinning a portion to be thinned of the insulating film to obtain a second insulating layer 50 with a thinned region X, wherein an orthographic projection of the portion to be thinned on the base substrate at least covers the orthographic projection of the first signal lead wire on the base substrate, but does not cover the orthographic projection of the second signal lead wire on the base substrate.

S103, forming a patterned shielding layer 60 on the second insulating layer 50, wherein the patterned shielding layer 60 includes a shielding portion 61 in the wiring region BB.

As shown in FIG. 4, firstly, a first conductive layer 20, a first insulating layer 30 and a second conductive layer 40 are formed sequentially on the base substrate 10. The first conductive layer 20 includes a first signal line formed in the display region AA and a first signal lead wire 21 formed in the wiring region BB, while the second conductive layer 40 includes a second signal line formed in the display region AA and a second signal lead wire 41 formed in the wiring region BB. In addition, the first signal lead wire 21 and the second signal lead wire 41 are at least separated by the first insulating layer 30, and the orthographic projection of the first signal lead wire 21 on the base substrate 10 does not overlap with the orthographic projection of the second signal lead wire 41 on the base substrate 10. Then, an insulating film covering the second conductive layer 40 is formed on the base substrate 10. As shown in FIG. 4, the second conductive layer 40 is hollowed out at positions other than the second signal line and the second signal lead wire 41, and the hollowed-out portions can expose the first insulating layer 30 below the second conductive layer 40. Therefore, the insulating film covering the second conductive layer 40 will cover the underlying first insulating layer 30 at the hollow-out portions of the second conductive layer 40. Since the orthographic projection of the first signal lead wire 21 on the base substrate 10 does not overlap with the orthographic projection of the second signal lead wire 41 on the base substrate 10, the insulating film will directly cover the first insulating layer 30 at a position where the insulating film corresponds to the orthographic projection of the first signal lead wire 21. The second insulating layer 50 having a thinned region X can be obtained by performing a thinning process on a portion of the insulating film corresponding to the orthographic projection position of the first signal lead wire 21. In this case, the thinned region X of the second insulating layer 50 corresponds at least to the orthographic projection position of the first signal lead wire 21. Finally, a patterned shielding layer 60 can be formed on the second insulating layer 50, which patterned shielding layer 60 includes a shielding portion 61 in the wiring region BB.

In this way, in the process for forming the second insulating layer 50, by introducing the thinning process of a portion in the thinned region X of the second insulating layer 50, the thickness of the second insulating layer 50 in the thinned region X can be made smaller than the thickness at other positions of the second insulating layer 50. Thus, the difference between the vertical distance from the first signal lead wire 21 to the shielding layer 60 and the vertical distance from the second signal lead wire 41 to the shielding layer 6i is reduced, thereby helping to keep the capacitance value between the first signal lead wire 21 and the shielding layer 60 approximate to the capacitance value between the second signal lead wire 41 and the shielding layer 60.

Further, as shown in FIG. 10, the manufacturing method according to embodiments of the present disclosure further includes the following steps.

S201, after forming the first insulating layer 30 on the base substrate 10, and before forming the insulating film covering the second conductive layer 40, forming an etch stop pattern 70, the orthographic projection of the etch stop pattern 70 on the second insulating layer 50 overlapping with the thinned region X.

As shown in FIG. 6, when the second insulating layer 50 is thinned by an etching process, it is generally difficult to control the degree of etching accurately only by the etching time or the like. Therefore, in a case where the thickness of the second insulating layer 50 in the thinned region X is reduced to 0 by etching, etching and thinning of the first insulating layer 30 below the second insulating layer 50 may inevitably be caused. In this case, after the first insulating layer 30 is formed on the base substrate 10, and before the insulating film covering the second conductive layer 40 is formed, an etch stop pattern 70 can be formed at a position corresponding to the thinned region X of the second insulating layer 50. In this way, in the process of thinning the thinned region X of the insulating film, when the etchant completely etches the insulating film in the thinned region X, the etchant will not be able to etch the etch stop pattern 70. In this way, on the one hand, it is possible to ensure complete etching of the insulating film in the thinned region X, and on the other hand, it is also possible to avoid any etching of the first insulating layer 30 below the etch stop pattern 70.

Optionally, as shown in FIG. 11 or FIG. 12, the step of forming the etch stop pattern 70 includes the following sub-steps.

S2011, forming a semiconductor film on the base substrate 10, and performing a patterning process on the semiconductor film to form an active layer pattern in the display region AA of the array substrate and an etch stop pattern 70.

Optionally, S2012, forming a transparent conductive film on the base substrate 10, and performing a patterning process on the transparent conductive film to form a pixel electrode pattern in the display region AA of the array substrate and an etch stop pattern 70.

In the manufacturing process for an array substrate provided by embodiments of the present disclosure, if the etch stop pattern 70 is separately introduced in the wiring region BB, it is necessary to increase the number of manufacturing steps for the array substrate, thereby complicating the manufacturing process. In view of this, optionally, as shown in FIG. 11, when the etch stop pattern 70 is made of a non-conductive material, it may be selected to be the same material as the active layer pattern in the display region AA. Further, after the semiconductor film is formed, by patterning the semiconductor film, it is possible to form the etch stop pattern 70 in the wiring region BB (in particular, corresponding to the thinned region X) while forming the active layer pattern in the display region AA. Alternatively, as shown in FIG. 12, when the etch stop pattern 70 is made of a conductive material, it may be selected to be the same material as the pixel electrode pattern in the display region AA. Further, after the transparent conductive film is formed, by patterning the transparent conductive film, it is possible to form the etch stop pattern 70 in the wiring region BB (in particular, corresponding to the thinned region X) while forming the pixel electrode pattern in the display region AA.

Optionally, as shown in FIG. 13, the manufacturing method provided by embodiments of the present disclosure includes the following steps.

S301, forming a first conductive layer 20, a first insulating layer 30 and a second conductive layer 40 sequentially on the base substrate 10, wherein the first conductive layer 20 includes a first signal lead wire 21 in the wiring region BB, the second conductive layer 40 includes the second signal lead wire 41 in the wiring region BB, and the orthographic projection of the first signal lead wire 21 on the base substrate 10 does not overlap with the orthographic projection of the second signal lead wire 41 on the base substrate 10.

S302, forming a non-conductive medium pattern 80 on the base substrate 10 on which the second conductive layer 40 is formed, wherein the non-conductive medium pattern 80 is located between the second conductive layer 40 and the shielding layer 60, and corresponds further to the orthographic projection of the second signal lead wire 41.

S303, forming a second insulating layer 50 on the base substrate 10 on which the second conductive layer 40 is formed.

S304, forming a patterned shielding layer 60 on the second insulating layer 50, which patterned shielding layer 60 includes a shielding portion 61 in the wiring region BB.

Firstly, a first conductive layer 20, a first insulating layer 30 and a second conductive layer 40 are formed sequentially on the base substrate 10, wherein the first conductive layer 20 includes the first signal line formed in the display region AA and the first signal lead wire 21 formed in the wiring region BB, while the second conductive layer 40 includes the second signal line formed in the display region AA and the second signal lead wire 41 formed in the wiring region BB. In addition, the first signal lead wire 21 and the second signal lead wire 41 are at least separated by the first insulating layer 30, and the orthographic projection of the first signal lead wire 21 on the base substrate 10 does not overlap with the orthographic projection of the second signal lead wire 41 on the base substrate 10. Then, the non-conductive medium pattern 80 corresponding to the orthographic projection of the second signal lead wire 41 and the second insulating layer 50 are formed.

It should be noted that the order of steps for forming the non-conductive medium pattern 80 (S302) and forming the second insulating layer 50 (S303) is not limited herein. For example, as shown in FIG. 8a, the non-conductive medium pattern 80 may be formed first, and then the second insulating layer 50 may be formed. Alternatively, the non-conductive medium pattern 80 may be formed at a position corresponding to the orthographic projection of the second signal lead wire 41 after the second insulating layer 50 is formed.

Finally, a patterned shielding layer 60 is formed on the second insulating layer 50, which patterned shielding layer 60 includes a shielding portion 61 located in the wiring region BB.

According to embodiments of the present disclosure, in the above process for manufacturing the array substrate, by introducing the non-conductive medium pattern 80, the vertical distance h2 between the second signal lead wire 41 and the shielding layer 60 can be increased. Thus, the vertical distance h1 between the first signal lead wire 21 and the shielding layer 60 is made approximate to the vertical distance h2 between the second signal lead wire 41 and the shielding layer 60.

The above embodiments are only used for explanations rather than limitations to the present disclosure. The ordinary skilled person in the related technical field, in the case of not departing from the spirit and scope of the present disclosure, may also make various modifications and variations. Therefore, all the equivalent solutions also fall within the scope of the present disclosure, and the protection scope of the present disclosure should be defined by the claims.

The invention claimed is:

1. An array substrate, comprising a display region and a wiring region around the display region, wherein the array substrate further comprises:
    a base substrate; and
    a first conductive layer, a first insulating layer, a second conductive layer, a second insulating layer and a patterned shielding layer sequentially stacked on the base substrate,
    wherein the shielding layer comprises a shielding portion in the wiring region,
    wherein the first conductive layer comprises a first signal lead wire in the wiring region,
    wherein the second conductive layer comprises a second signal lead wire in the wiring region, and
    wherein an orthographic projection of the first signal lead wire on the base substrate does not overlap an orthographic projection of the second signal lead wire on the base substrate,
    wherein a difference between a vertical distance from the first signal lead wire to the shielding portion and a vertical distance from the second signal lead wire to the shielding portion is less than a thickness of the first insulating layer,
    wherein an orthographic projection of the shielding portion on the base substrate overlaps the orthographic projections of the first signal lead wire and the second signal lead wire,
    wherein the second insulating layer comprises a thinned region,
    wherein an orthographic projection of the thinned region on the base substrate at least overlaps the orthographic projection of the first signal lead wire on the base substrate, but does not overlap the orthographic projection of the second signal lead wire on the base substrate,
    wherein the second insulating layer has an opening formed in the thinned region,
    wherein the array substrate further comprises an etch stop pattern in the thinned region of the second insulating layer, and
    wherein the etch stop pattern comprises a non-conductive medium.

2. The array substrate according to claim 1,
    wherein the vertical distance from the first signal lead wire to the shielding portion is equal to the vertical distance from the second signal lead wire to the shielding portion.

3. The array substrate according to claim 2,
    wherein the second insulating layer comprises a thinned region,
    wherein an orthographic projection of the thinned region on the base substrate at least overlaps the orthographic projection of the first signal lead wire on the base substrate, but does not overlap the orthographic projection of the second signal lead wire on the base substrate.

4. The array substrate according to claim 2, further comprising:
    a non-conductive medium pattern between the second conductive layer and the shielding layer,
    wherein an orthographic projection of the non-conductive medium pattern on the base substrate at least overlaps the orthographic projection of the second signal lead wire on the base substrate, but does not overlap the orthographic projection of the first signal lead wire on the base substrate.

5. The array substrate according to claim 1, wherein the etch stop pattern is in a same layer and of a same material as an active layer pattern in the display region of the array substrate.

6. The array substrate according to claim 1, wherein the etch stop pattern comprises a conductive material and is formed integrally with the shielding layer.

7. The array substrate according to claim 6, wherein the etch stop pattern is in a same layer and of a same material as a pixel electrode pattern in the display region of the array substrate.

8. The array substrate according to claim 1, further comprising:
    a non-conductive medium pattern between the second conductive layer and the shielding layer,
    wherein an orthographic projection of the non-conductive medium pattern on the base substrate at least overlaps the orthographic projection of the second signal lead wire on the base substrate, but does not overlap the orthographic projection of the first signal lead wire on the base substrate.

9. The array substrate according to claim 8, wherein the non-conductive medium pattern is between the second insulating layer and the shielding layer.

10. A display device, comprising the array substrate according to claim 1.

11. An array substrate, comprising a display region and a wiring region around the display region, wherein the array substrate further comprises:
    a base substrate; and
    a first conductive layer, a first insulating layer, a second conductive layer, a second insulating layer and a patterned shielding layer sequentially stacked on the base substrate,
    wherein the shielding layer comprises a shielding portion in the wiring region,
    wherein the first conductive layer comprises a first signal lead wire in the wiring region,
    wherein the second conductive layer comprises a second signal lead wire in the wiring region, and
    wherein an orthographic projection of the first signal lead wire on the base substrate does not overlap an orthographic projection of the second signal lead wire on the base substrate,
    wherein a difference between a vertical distance from the first signal lead wire to the shielding portion and a vertical distance from the second signal lead wire to the shielding portion is less than a thickness of the first insulating layer,
    wherein an orthographic projection of the shielding portion on the base substrate overlaps the orthographic projections of the first signal lead wire and the second signal lead wire, wherein the array substrate further comprises a non-conductive medium pattern between the second conductive layer and the shielding layer, wherein an orthographic projection of the non-conductive medium pattern on the base substrate at least overlaps the orthographic projection of the second signal lead wire on the base substrate, but does not overlap the orthographic projection of the first signal lead wire on the base substrate, and wherein the non-conductive medium pattern is between the second conductive layer and the second insulating layer.

12. A manufacturing method for an array substrate, comprising;

forming a first conductive layer, a first insulating layer and a second conductive layer sequentially on a base substrate, wherein the first conductive layer comprises a first signal lead wire, the second conductive layer comprises a second signal lead wire, and wherein there is no overlap between an orthographic projection of the first signal lead wire on the base substrate and an orthographic projection of the second signal lead wire on the base substrate;

forming an insulating film covering the second conductive layer on the base substrate, and thinning a portion to be thinned of the insulating film to obtain a second insulating layer with a thinned region, wherein an orthographic projection of the portion to be thinned on the base substrate at least overlaps the orthographic projection of the first signal lead wire on the base substrate, but does not overlap the orthographic projection of the second signal lead wire on the base substrate; and forming a patterned shielding layer on the second insulating layer, after forming the first insulating layer on the base substrate, and before forming the insulating film overlapping the second conductive layer, forming an etch stop pattern, wherein an orthographic projection of the etch stop pattern on the second insulating layer overlaps with the thinned region, wherein the shielding layer comprises a shielding portion, wherein an orthographic projection of the shielding portion on the base substrate overlaps the orthographic projections of the first signal lead wire and the second signal lead wire, wherein the array substrate comprises a display region and a wiring region around the display region, and wherein the first signal lead wire, the second signal lead wire and the shielding portion are formed in the wiring region, and wherein the forming the etch stop pattern comprises:
forming a semiconductor film on the base substrate; and
performing a patterning process on the semiconductor film to form an active layer pattern in the display region of the array substrate and the etch stop pattern.

13. The manufacturing method for an array substrate according to claim 12, wherein the forming the etch stop pattern comprises:
forming a transparent conductive film on the base substrate; and
performing a patterning process on the transparent conductive film to form a pixel electrode pattern in the display region of the array substrate and the etch stop pattern.

* * * * *